(12) United States Patent  
Rouphael et al.

(10) Patent No.: US 7,366,490 B2
(45) Date of Patent: Apr. 29, 2008

(54) AUTOMATIC GAIN CONTROL WITH GAIN STEPPING AND REGULATION

(75) Inventors: Antoine J. Rouphael, Escondido, CA (US); William D. Southcombe, San Diego, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 407 days.

(21) Appl. No.: 10/979,703

(22) Filed: Nov. 2, 2004

(65) Prior Publication Data

US 2006/0094384 A1    May 4, 2006

(51) Int. Cl.
*H04B 1/06* (2006.01)
(52) U.S. Cl. ............... 455/234.1; 455/67.11; 455/226.1; 375/345
(58) Field of Classification Search ......... 455/240.1, 455/234.1, 245.1, 246.1, 67.11, 226.1, 226.2, 455/232.1; 375/345, 346
See application file for complete search history.

(56) References Cited

U.S. PATENT DOCUMENTS

| | | | | |
|---|---|---|---|---|
| 5,448,595 A | * | 9/1995 | Kaku et al. ................. | 375/345 |
| 5,563,916 A | | 10/1996 | Scarpa | |
| 5,627,857 A | * | 5/1997 | Wilson ........................ | 375/219 |
| 6,081,565 A | * | 6/2000 | Marandi et al. ............ | 375/345 |
| 6,154,503 A | * | 11/2000 | Strolle ........................ | 375/264 |
| 6,212,244 B1 | * | 4/2001 | Davidovici et al. ......... | 375/345 |
| 7,054,395 B2 | * | 5/2006 | Azakami et al. ............ | 375/345 |
| 7,103,029 B1 | * | 9/2006 | Minowa ...................... | 370/342 |
| 7,116,942 B2 | * | 10/2006 | Hasegawa ................ | 455/67.11 |
| 2003/0139160 A1 | | 7/2003 | Yang | |

FOREIGN PATENT DOCUMENTS

| EP | 1 164 788 A2 | | 12/2001 |
|---|---|---|---|
| EP | 1164788 A2 | * | 12/2001 |

* cited by examiner

*Primary Examiner*—Quochien B. Vuong
(74) *Attorney, Agent, or Firm*—Patti, Hewitt & Arezina LLC

(57) ABSTRACT

An automatic gain control device and a related method for its operation, using a first-order control loop for adjusting a received communication signal to compensate for variations in received signal power. The device bases its adjustments on a measure of the average received root-mean-square (rms) signal power and, in its preferred form, adjusts a loop gain adaptively to react rapidly to large input signal variations. The loop gain is adjusted based on measurement of the average power of an error signal and on the sign of the error signal power. Optional features include an automatically adjustable power set point.

18 Claims, 8 Drawing Sheets

AUTOMATIC GAIN CONTROL WITH GAIN STEPPING AND REGULATION

BACKGROUND OF THE INVENTION

This invention relates to automatic gain control (AGC) Loop circuits, usually referred to as AGC loops because automatic gain control necessarily requires a feedback loop of some kind. (There are forward type AGCs that do not require a feedback loop.) AGC loops are used in communication systems to improve receiver operation by varying the gain applied to received signals based upon their detected power. AGC loops are needed in most communication systems because, as a practical matter, received signals are always subject to variations in power. The task of gain control is further complicated by the presence of interfering signals.

Designers of communication receivers face a fundamental choice between first-order AGC loops and second or higher-order AGC loops. The loop "order" is a basic characteristic of feedback control loops in general, not just AGC loops, and refers to the number of mathematical integrators in the loop. First-order loops are less complex and are known for their stability, i.e., their ability to converge on a desired steady-state signal value relatively quickly when there is a change in the received signal strength. For certain received signal conditions, however, first-order loops may not perform as well as desired, and in particular may not react fast enough to large or small received signal changes. First order loops are optimized either for speed or accuracy in performance. In the former case, a large loop bandwidth (equivalent noise bandwidth of the loop) in which the loop can react fast to a change in signal power suffers from poor performance. On the other hand, a first order loop with small loop bandwidth is very slow to react, however, it has a superior performance compared with loops with large bandwidths. For example, in the presence of strong interfering signals, they may tend to clip the interfering signal and thus desensitize the relatively weak desired signal. Second-order and higher-order loops have a theoretically more desirable response characteristic for many applications, but are in general not used because of their potential instability.

Ideally, what is needed is an AGC loop that has the stability of a first-order loop but also has the ability to react rapidly in the presence of large signal changes, interference signals, or in a frequency-hopping communications environment. The present invention is directed to these goals.

SUMMARY OF THE INVENTION

The present invention resides in an automatic gain control (AGC) loop that always operates in a first-order, stable mode, but reacts fast enough to large signals by adapting itself to those signals, and then reverting back to its nominal setting as needed. The AGC loop of the invention relies principally on error-signal power detection techniques that result in selected different gain values being fed to a single-pole loop filter, which operates as a stable first-order loop at all times.

Briefly, and in general terms, the invention may be defined as an automatic gain control (AGC) device for generating amplifier control signals to adjust to a desired level a received communication signal that varies in power, the AGC device comprising a first computational module, for generating a signal representative of the average power of the received communication signal; a second computational module, for generating an error signal representative of the difference between the average power signal generated by the first computational module and a selected power set point; and a third computational module, for generating an amplifier control signal from the error signal. The generated amplifier control signal is responsive to variations in the average power of the received signal.

More specifically, the third computational module comprises a loop gain amplifier for amplifying the error signal; a summing module for combining the amplified error signal with another input signal; and a delay module for receiving the output of the summing module and providing as output the amplifier control signal. The other input signal to the summing module is derived from output of the delay module, and represents the amplifier control signal in an earlier computation cycle.

Preferably, the AGC device further comprises a fourth computational module for controlling the gain of the loop gain amplifier in accordance with the average error signal power. Specifically, the fourth computational module comprises an error signal power determination module; an error signal sign determination module; and a gain decision module receiving input signals from the error signal power determination module and the error signal sign determination module, and selecting a loop amplifier gain based on the inputs received.

Optionally, the AGC device may also comprise a set point selection module, wherein the power set point supplied to the second computational module is automatically selected based on measurements made on the received communication signal.

The invention may also be defined in terms of a method of automatic gain control, comprising the steps of generating a signal representative of the average power of a received communication signal; generating an error signal representative of the difference between the average power signal and a selected power set point; and generating an amplifier control signal from the error signal. Thus, the generated amplifier control signal is responsive to variations in the average power of the received signal.

Preferably, the method also comprises a step of controlling the gain of the loop gain amplifier in accordance with average error signal power. Specifically, the step of controlling the gain of the loop gain amplifier comprises determining the average power of the error; determining the algebraic sign of the average power of the error signal; and selecting, based on the error signal power the error signal algebraic sign, determination module, a loop amplifier gain.

In defining the invention in this summary and in the claims below, the expression "signal representative of the average power" and similar expressions are used. The term "representative of" is intended to encompass signals that are directly proportional to the power, or those that are directly proportional to some mathematical function of the power, such as the square of the power. For processing convenience, as will become apparent from the detailed description that follows, the square of the power is used in the presently preferred embodiments of the invention. Also in this summary and in the claims, the term "AGC device" is used with the intent of encompassing implementations in software, programmable hardware, or integrated or discrete circuitry.

It will be appreciated from this summary that the present invention represents a significant advance in the field of automatic gain control circuits and devices. In particular, the AGC device of the invention has the stability advantages of a first-order control loop, but still adapts rapidly to large input signal variations. Other aspects and advantages of the invention will become apparent from the following more detailed description, taken in conjunction with the accompanying drawings.

DETAILED DESCRIPTION OF THE INVENTION

Figure 1:
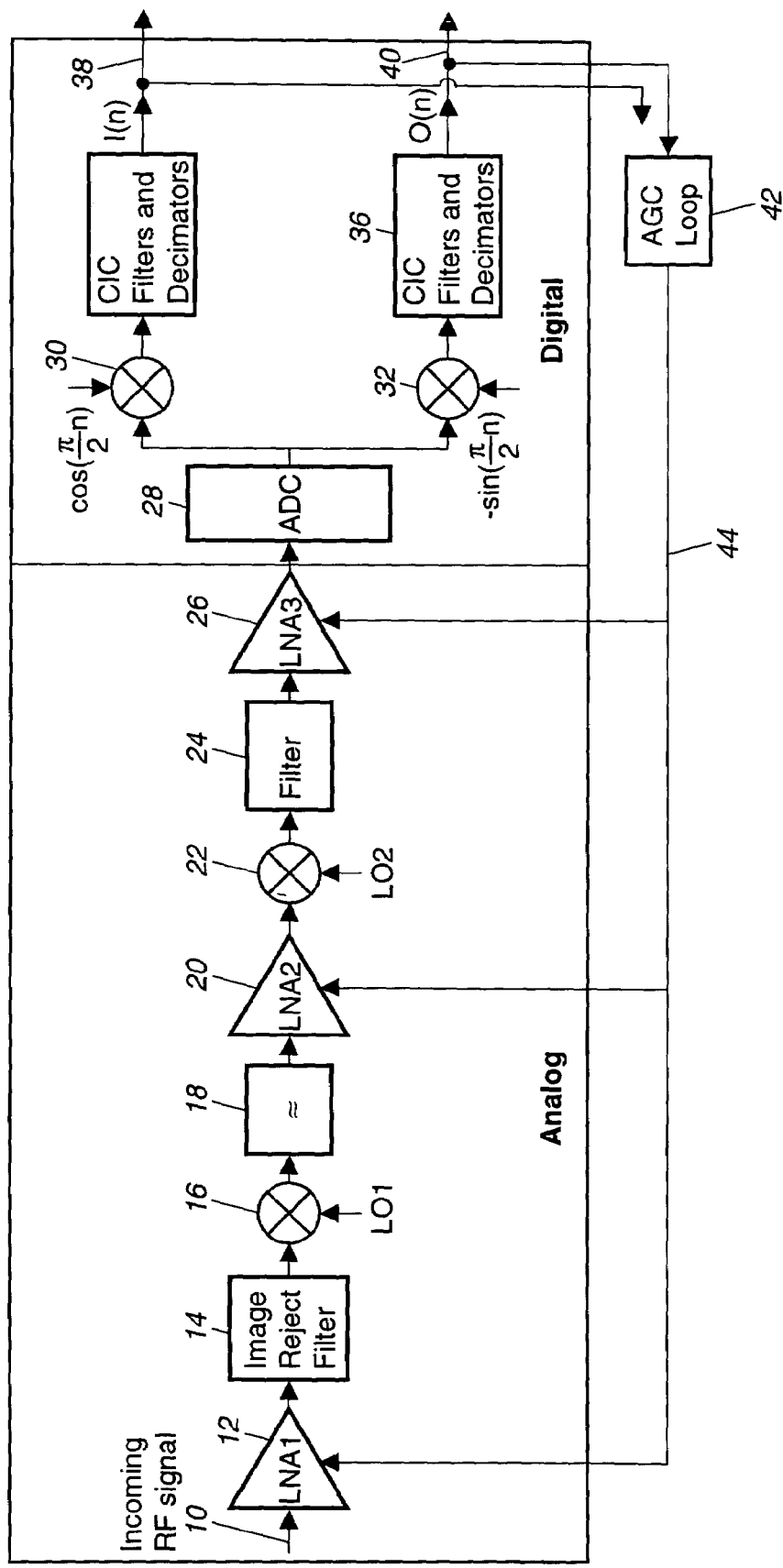
FIG. 1 is a conceptual block diagram of a receiver that includes the automatic gain control (AGC) loop of the present invention.

As shown in the drawings, the present invention pertains to automatic gain control (AGC) circuits or loops. As briefly discussed above, first-order AGC loops are preferably used in communication receivers because of their known stability of operation. First-order AGC loops do not, however, normally react fast enough to large signal inputs, and therefore do not provide appropriate gain control in some communication applications.

In accordance with the present invention, a relatively simple, first-order AGC loop is provided with enhanced capability to adapt to large input and error signals and then to readapt to its nominal settings when the need for a more rapid response has passed. The invention will be described in the context of a typical communications receiver, which is conceptually illustrated in FIG. 1.

The receiver is shown as including a front-end analog section with amplifying, filtering and mixing stages. Specifically, the front end of the receiver is shown as including a first low noise amplifier (LNA) indicated by reference numeral 10 and designated LNA1, which receives an incoming radio frequency (RF) signal on line 12, an image reject filter 14 coupled to the output of LNA1, and a first mixer 16 connected to receive the output of the filter and having a second input to which a local oscillator signal LO1 is applied. The output of the first mixer 16 is further processed by another filter 18, a second low noise amplifier 20 designated LNA2, a second mixer 22 to which a second local oscillator signal LO2 is applied, another filter 24, and finally a third low noise amplifier 26 designated LNA3. It will be understood, of course, that there is nothing novel in this analog front end architecture and nothing critical to the invention in the use of two mixer stages for downconversion of the received RF input signals to an intermediate frequency (IF) signal such as the one output from the third low noise amplifier 26. Note also that the invention is not restricted to the use of LNAs at this point; the LNAs could be replaced by a variable gain amplifier (VGA).

The conceptual receiver illustrated in FIG. 1 further includes a digital module, including an analog-to-digital converter (ADC) 28, the digital output of which is connected to two parallel digital mixers 30 and 32, which have as additional inputs the in-phase and quadrature components of a digital local oscillator signal. The outputs of the digital mixers 30 and 32 are further processed by digital lowpass filters 34 and 36, respectively, which provide digital in-phase (I) and quadrature (Q) output signals on lines 38 and 40, respectively, for further processing by other components (not shown) downstream from the receiver.

To control the gain of the signals on lines 38 and 40, these signals are also coupled to an AGC loop 42, which generates appropriate amplifier control signals on lines 44, which are fed back to the low noise amplifiers 12, 20 and 26. The structure of the AGC loop 42 will now be discussed in more detail with reference to FIG. 2.

The AGC loop 42 obtains I and Q output signals from the digital low pass filters 34 and 36 on lines 38 and 40, respectively. At this point in processing, it is assumed that the I and Q digital data streams have been decimated to a data rate convenient for further processing. The decimated I and Q signals are separately squared in squaring circuits 50 and 52, respectively, added together in a summing circuit 54, and then further processed in a computation module 56 that generates a signal that is a measure of the input power. Further details of module 56 are discussed below.

The measure of input power is input to a summer 58, which also receives a set-point input signal on line 60. The summer 58 output, on line 62, is amplified by a loop amplifier 64, which applies a loop gain of µ to the difference between the set-point signal and the measure of input power. There is no amplification since µ is must be less than 1. The loop amplifier 64 provides an output on line 66 to another summer 68, and the output of the summer 68 is connected, in turn, to a loop delay circuit 70, which interjects a delay of one sample time this process is called a running sum and serves to estimate the desired gain needed to amplify or attenuate the received signal. The delay circuit 70 output is fed back over line 72 to provide a second input to the summer 68.

Figure 2:
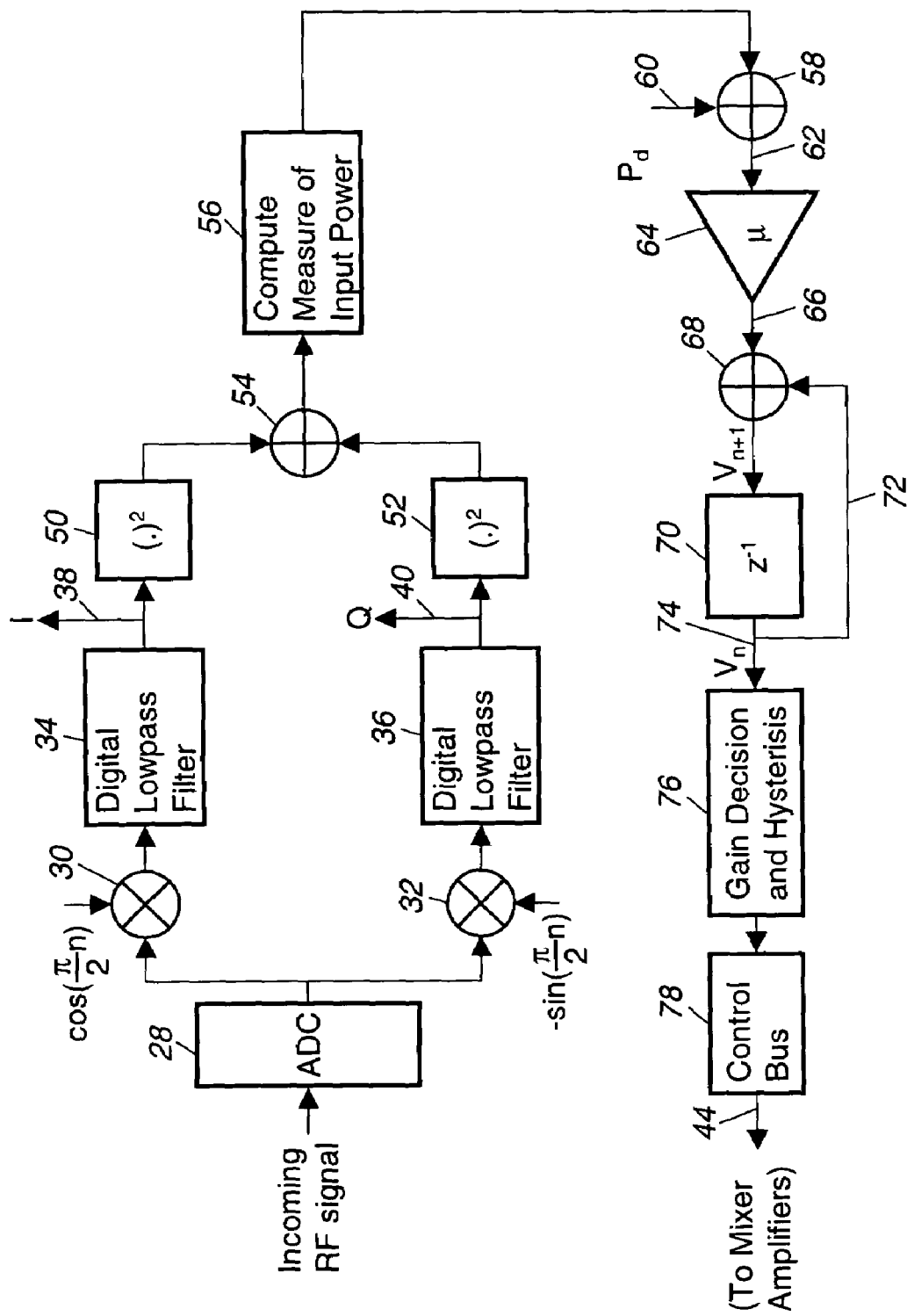
FIG. 2 is block diagram of a first order AGC loop

The output signal from the delay circuit 70 of the AGC loop is also coupled through line 74 to a gain decision and hysteresis block 76, which determines the adjustments, if any, to made to the gains of the low noise amplifiers 12, 20 and 26 (FIG. 1). Finally, a control signal distribution 78 distributes control signals to the low noise amplifiers, as indicated by lines 44. Further details of the AGC loop are shown in FIG. 3, in which the same reference numerals as in FIGS. 1 and 2 are used to refer to identical components.

Figure 3:
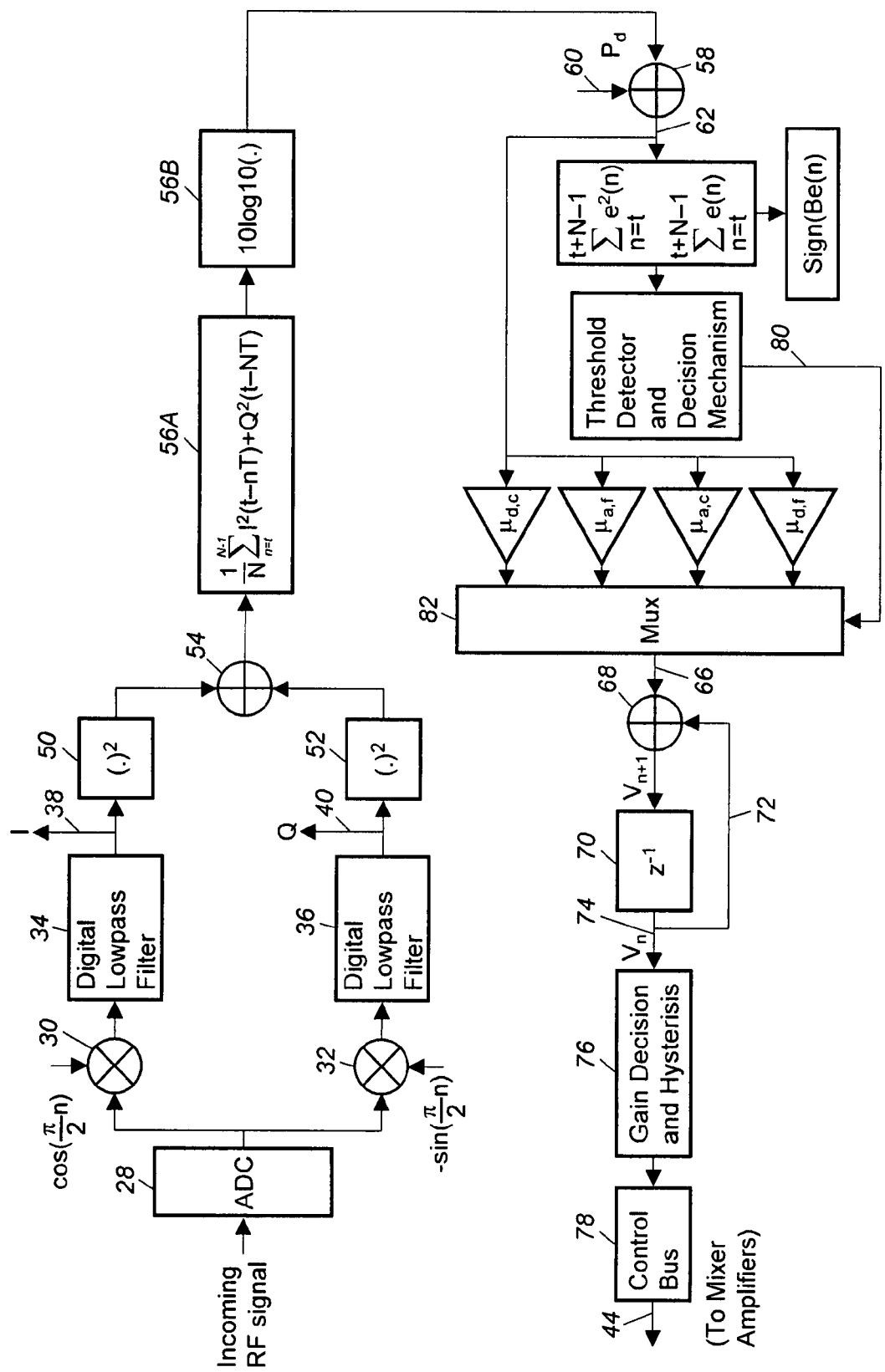
FIG. 3 is an expanded block diagram of the AGC loop, depicting the technique of the invention as it relates to adaptively changing the loop filter gain in accordance with the nature of the error signal.

As shown in FIG. 3, the computational module 56 (FIG. 2) for computing a measure of input power has two sub-components, indicated as blocks 56A and 56B. In block 56A, an integrate-and-dump function is performed on the incoming I and Q signals, as expressed by:

$$\frac{1}{N}\sum_{n=1}^{N-1} I^2(t-nT) + Q^2(t-NT)$$

where n refers to the sample number in a series of samples, N denotes the total number of samples in the summation performed, t denotes time from the start of a block of samples, and T is the time interval between samples.

In block 56B, the following function is performed on the output of block 56A: $10 \log_{10}(.)$ The need for performing the logarithm operation arises from the nature of a typical low-noise amplifier gain characteristic, which can be modeled as an exponential voltage gain amplifier (VGA) type of function of the form $10^{(.)/10}$. The logarithm is also used to compress the input signal power and allow the loop to react fast to power changes. The output of block 56B provides a measure of the rms (root mean square) input power, designated $r_n$, for reasons that are made more apparent from the following mathematical relationships. More precisely, the output of block 56B provides signals proportional to the square of the rms input power, i.e., $r_n^2$.

The state space relation of the AGC loop may be expressed by the following equation:

$$v_{n+1} = v_n + \mu e_n = v_n + \mu[P_d - 10 \log_{10}(E\{10^{2v_n/10} r_n^2\})],$$

where:

$v_n$ is the state at the output of summer 68, $\mu$ is the loop gain, $e_n$ is the error signal output from summer 58, $P_d$ is the set point signal on line 60, and E represents an expected value operator, in this case performed by the integrate and dump function in box 56A.

The expectation operator serves as a lowpass filter to remove the effect of zero-mean white noise in the input signal. The above equation may be expressed differently as:

$$v_{n+1} = v_n + \mu(P_d - 2v_n - 10 \log_{10}(\hat{r}_n^2)) = (1-2\mu)v_n + \mu(P_d - 10 \log_{10}(\hat{r}_n^2))$$

where $$\hat{r}_n^2 = E\{r_n^2\}$$

is the rms input power.

In the event that the I and Q signals resemble white Gaussian noise, the envelope $r_n^2$ has a Rayleigh distribution. The distribution becomes Rician in the presence of a dominant narrowband signal.

The following discussion pertains to the steady state response of the AGC loop and stability considerations. During steady state operation, the mean of the error $e_n$ is zero and $v_{n+1} = v_n = v$. The expression immediately above then becomes:

$$v = (1-2\mu)v + \mu(P_d - 10 \log_{10}(\hat{r}_n^2)).$$

Solving for v in yields:

$$v = \frac{P_d - 10 \log_{10}(\hat{r}_n^2)}{2}.$$

This equilibrium point is pivotal in computing the instantaneous dynamic range of the AGC loop. If we let $\chi_n$ be the perturbation around the equilibrium point during steady state, then $$v + \chi_{n+1} = (1-2\mu)(v+\chi_n) + \mu(P_d - 10 \log_{10}(\hat{r}_n^2))$$

Simplifying this relation yields:

$$\chi_{n+1} = (1-2\mu)\chi_n - 2\mu v + \mu(P_d - 10 \log_{10}(\hat{r}_n^2))$$

Substituting for v.results in:

$$\chi_{n+1} = (1-2\mu)\chi_n - 2\mu \frac{P_d - 10 \log_{10}(\hat{r}_n^2)}{2} + \mu(P_d - 10 \log_{10}(\hat{r}_n^2))$$

$$= (1-2\mu)\chi_n$$

The above relation can be further expressed as:

$$\chi_{n+1} = (1-2\mu)^n \chi_0$$

In order for the AGC loop to be stable, this expression must converge to zero as n approaches infinity, thus imposing the relation:

$$|1-2\mu| < 1 \Rightarrow \begin{cases} \mu > 0 \\ \mu < 1 \end{cases}$$

In the above discussion, it is assumed that the AGC loop has the same attack and decay time. Attack and decay time refers to the rate at which the AGC reacts to sudden increases and decreases, respectively, in the input signal. It is well known from control theory that the attack or decay time constant is inversely proportional to the loop gain $\mu$.

An important aspect of the invention is that the AGC loop is modified to include measurement of error signal energy, and that the average error signal energy is used to select an appropriate loop gain $\mu$. To this end, the AGC loop of the invention also includes an error signal energy detector block (FIG. 3), connected between summer 58 and summer 68, that includes an integrate-and-dump block, connected to an output of summer 58 by line 62, that averages the error signal, a sign block, connected to an output of the integrate-and-dump block, that determines the sign of the average of the error signal, and a gain and switch block, connected to a second output of the integrate-and-dump block and an input to summer 68 by line 66, to effect appropriate switching of the loop gain $\mu$. Averaging of the error signal energy in the integrate-and-dump block is effected by an integrate-and-dump operation that may be expressed as:

$$e_{avg}^2(n) = \sum_{n=0}^{N-1} e^2(t - nT)$$

If the average error energy exceeds a certain threshold $\Gamma$, this implies that a sudden increase or decay in the incoming signal energy has taken place, and the AGC is controlled to use a large loop filter gain to compensate more rapidly for the change in received signal magnitude. This mode is referred to as the coarse AGC mode. The coarse AGC loop exhibits a low loop signal-to-noise ration (SNR) to allow for fast tracking of the input signal. If the error signal energy is less than the threshold $\Gamma$, then the loop filter gain remains at its original low setting. This mode is known as the fine AGC mode. The loop exhibits a high SNR at this slower tracking speed. Therefore, the attack and decay time can change depending on the input signal condition if it is desired to change the loop behavior accordingly.

The sign of the average error signal is expressed as:

$$\text{sign}\{e_{avg}(n)\} = \begin{cases} 1 & \text{sign}\left\{\sum_{m=0}^{M-1} e(t-m)\right\} \geq 0 \\ -1 & \text{sign}\left\{\sum_{m=0}^{M-1} e(t-m)\right\} < 0 \end{cases}$$

In this expression, M is a programmable parameter that indicates the number of samples taken in the averaging process. The sign of the average error is used to indicate whether the AGC loop is in attack mode (positive average error) or decay mode (negative average error). The sign determination is made in the sign block (FIG. 3) and transmitted to a threshold detector and decision mechanism block, which is connected to the second output of the integrate-and-dump block and line 80. Based on the sign of the average error (which determines whether the AGC mode is attack or decay) and on the comparison of the average error with the threshold (which determines whether the AGC mode is coarse or fine), the decision mechanism in the threshold detector and decision mechanism block generates a loop gain selection signal on line 80, which results in the selection of one of four gain values by a multiplexer 82. The four gain values are $\mu_{dc}$, $\mu_{af}$, $\mu_{ac}$ and $\mu_{df}$, where the subscripts d and a refer to the decay and attack modes, respectively, and the subscripts c and f refer to the coarse and fine modes, respectively. Selection of the loop gain can be expressed by the relation:

$$\mu = \begin{cases} \mu_{a,f} & e_{avg}^2(n) < \Gamma, \text{sign}\{e_{avg}(n)\} < 0 \\ \mu_{d,f} & e_{avg}^2(n) < \Gamma, \text{sign}\{e_{avg}(n)\} \geq 0 \\ \mu_{a,c} & e_{avg}^2(n) \geq \Gamma, \text{sign}\{e_{avg}(n)\} < 0 \\ \mu_{d,c} & e_{avg}^2(n) \geq \Gamma, \text{sign}\{e_{avg}(n)\} \geq 0 \end{cases}$$

In effect, the magnitude of the average error signal is used to determine the magnitude of the loop gain, and the sign of the average error signal is used to determine whether the gain needs to be increased or decreased, based on whether the AGC is in attack or decay mode. It will be readily appreciated that the principle of the invention is not limited to use of a single threshold to determine the loop gain. One could also employ multiple thresholds and choose from a larger number of gain values.

Figure 4:
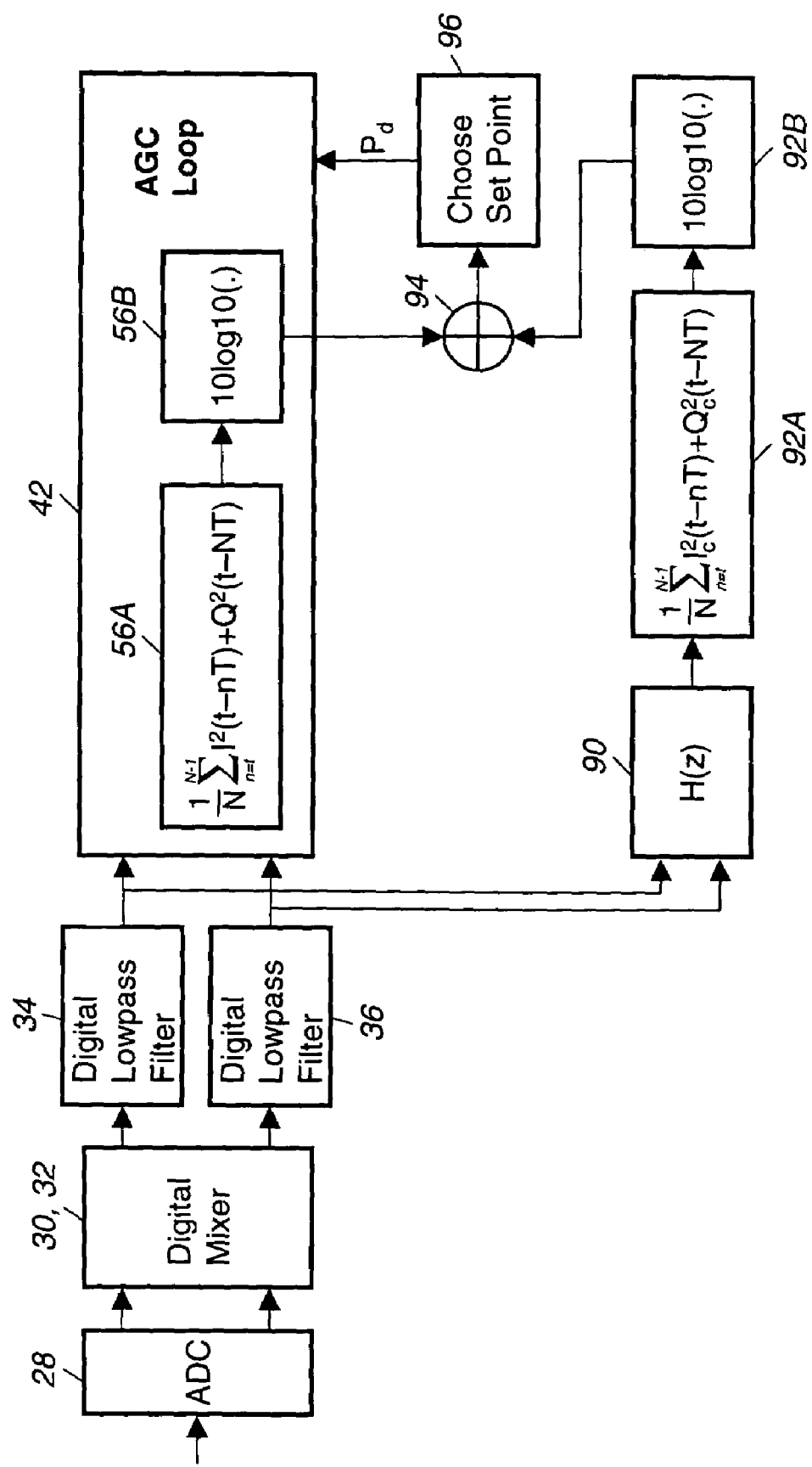
FIG. 4 is a block diagram showing how a variable AGC set-point feature may be incorporated into the AGC loop of the invention.

A further optional feature of the AGC loop of the invention is the ability to provide a variable set point $P_d$ depending on the difference between the signal energy or power, derived as previously described, and the signal energy after passing through a channel filter. If this difference is greater than a preselected threshold, a higher value of $P_d$ is chosen. The scheme for varying the set point is depicted in FIG. 4. The digital input signals are passed through a channel filter 90, the output of which is processed in blocks 92A and 92B in much the same way that the original input signals are processed in blocks 56A and 56B. In other words, the signal energy at the output of the channel filter 90 is estimated using an integrate-and-dump function:

$$\frac{1}{GN}\sum_{n=t}^{N-1} I_c^2(t-nT) + Q_c^2(t-NT)$$

where G is a gain adjustment and the subscript c refers to input signals passed through the channel filter. This estimated signal energy is input to a summer 94, the other input of which receives the estimated signal energy of the original signal, not passed through the channel filter 90. The summer 94 generates a difference signal given by:

$$E_\Delta = \frac{1}{N}\sum_{n=t}^{N-1} I^2(t-nT) + Q^2(t-NT) - \frac{1}{GN}\sum_{n=t}^{N-1} I_c^2(t-nT) + Q_c^2(t-NT)$$

An appropriate set point is chosen, as indicated in block 96, depending on the value of this difference, as given by:

$$P_d = \begin{cases} P_{d,high} & E_\Delta > \rho \\ P_{d,low} & E_\Delta \leq \rho \end{cases}$$

where $\rho$ is an estimate of the out-of-band noise energy before channel filtering.

As in any AGC implemented with discrete gain steps, a hysteresis is often necessary when switching a gain stage on and off. Gain stages farthest away from the antenna are turned on first in order to minimize the noise figure of the receiver. Once a gain stage is switched on or off, the AGC loop may not switch it back off despite a drop or increase in the signal level until a certain power threshold is surpassed. Failure to present adequate hysteresis results in AM-modulating the received signal. The important point to note is that the fixed point implementation of the loop must be designed such that the quantized levels are much smaller than the required gain steps, which is normally the case.

Figure 5:
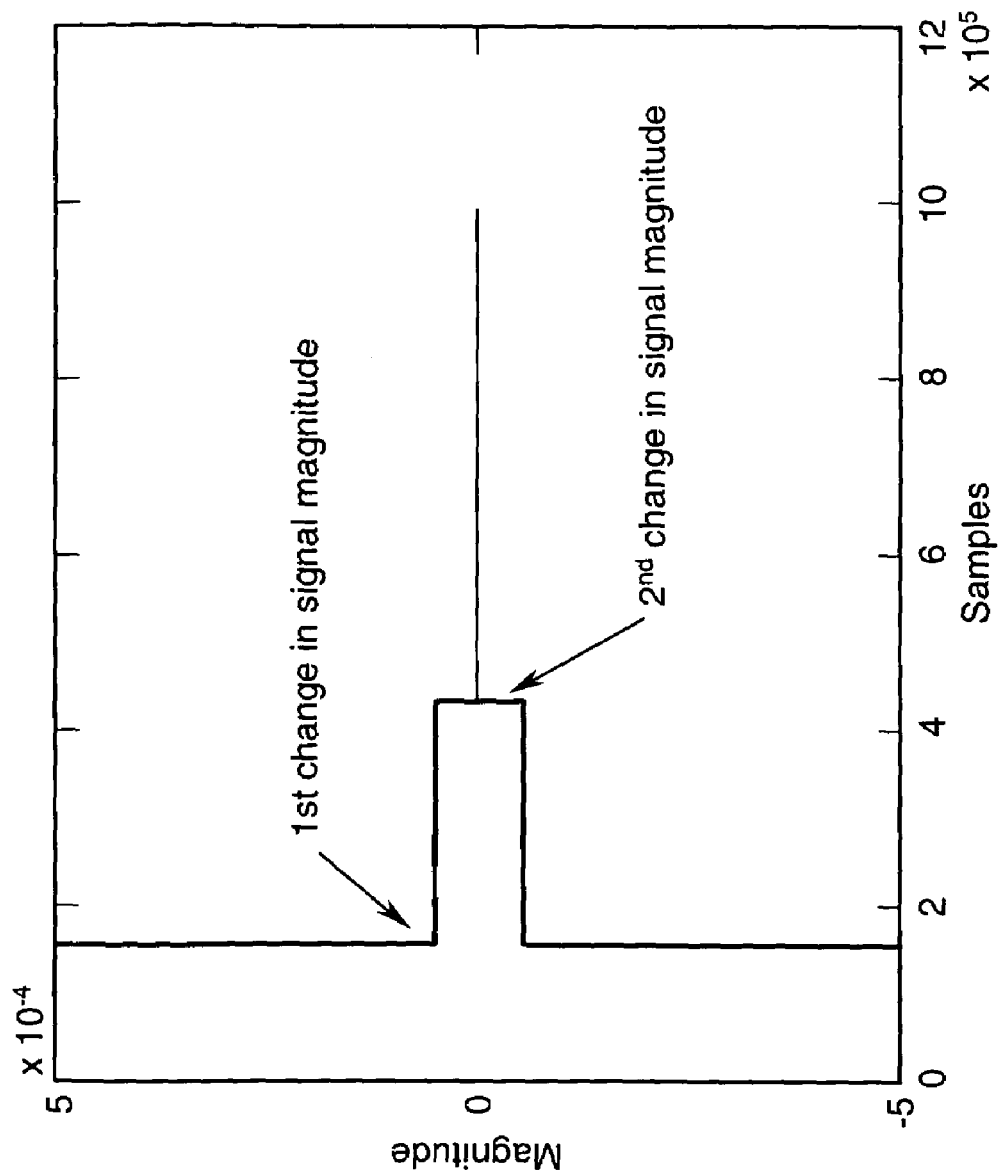
FIG. 5 is a graph of an in-phase input signal used in simulation of AGC loop operation.

FIG. 5 is a graph showing the magnitude changes in a sample input signal, including a first step change (reduction) in magnitude and, a short time later, another step change, also reducing the magnitude. Although not apparent from the figure, which plots magnitude on a linear scale, the second change is much greater than the first in signal power (dB) terms, specifically 10 dB for the first change versus 40 dB for the second.

Figure 6:
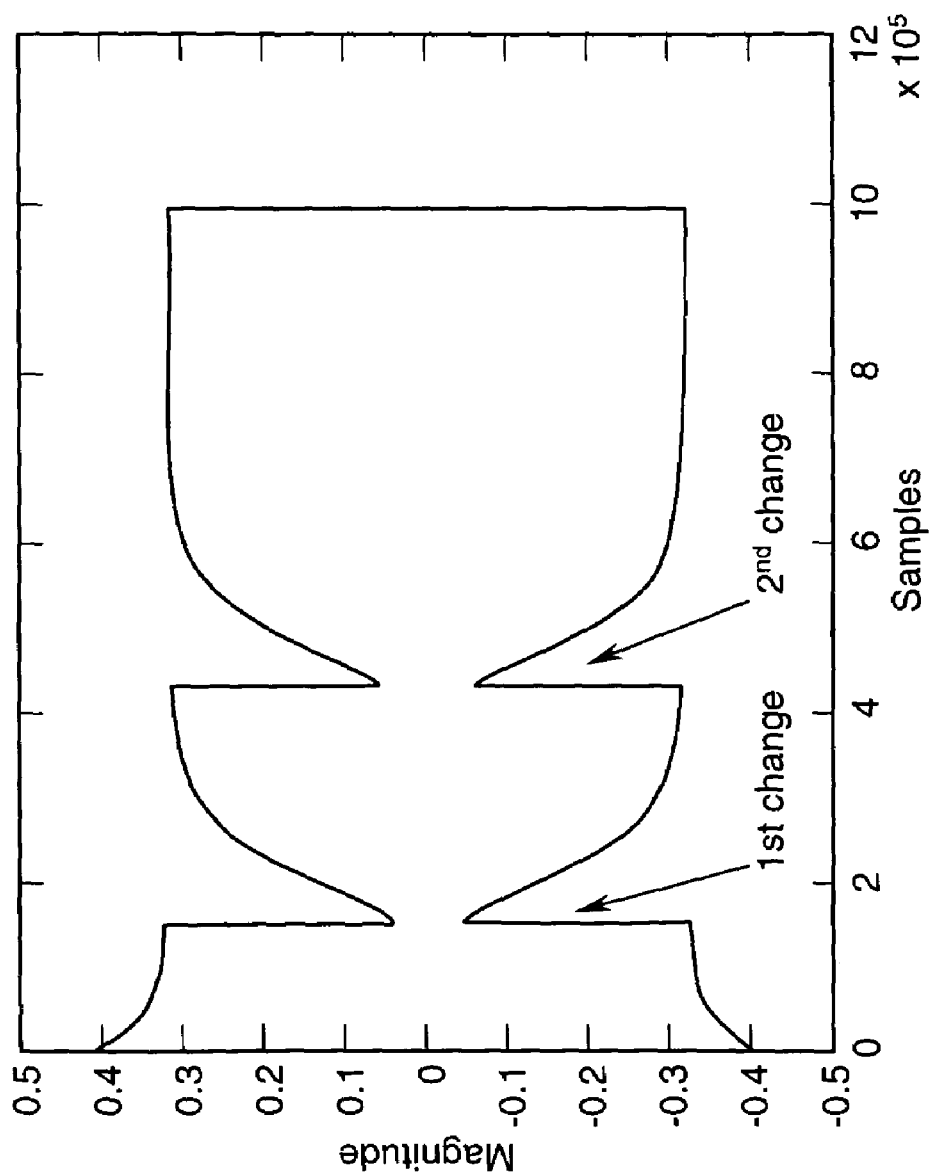
FIG. 6 is a graph showing the in-phase signal of FIG. 5 after adjustment by the AGC loop of the invention.
Figure 7:
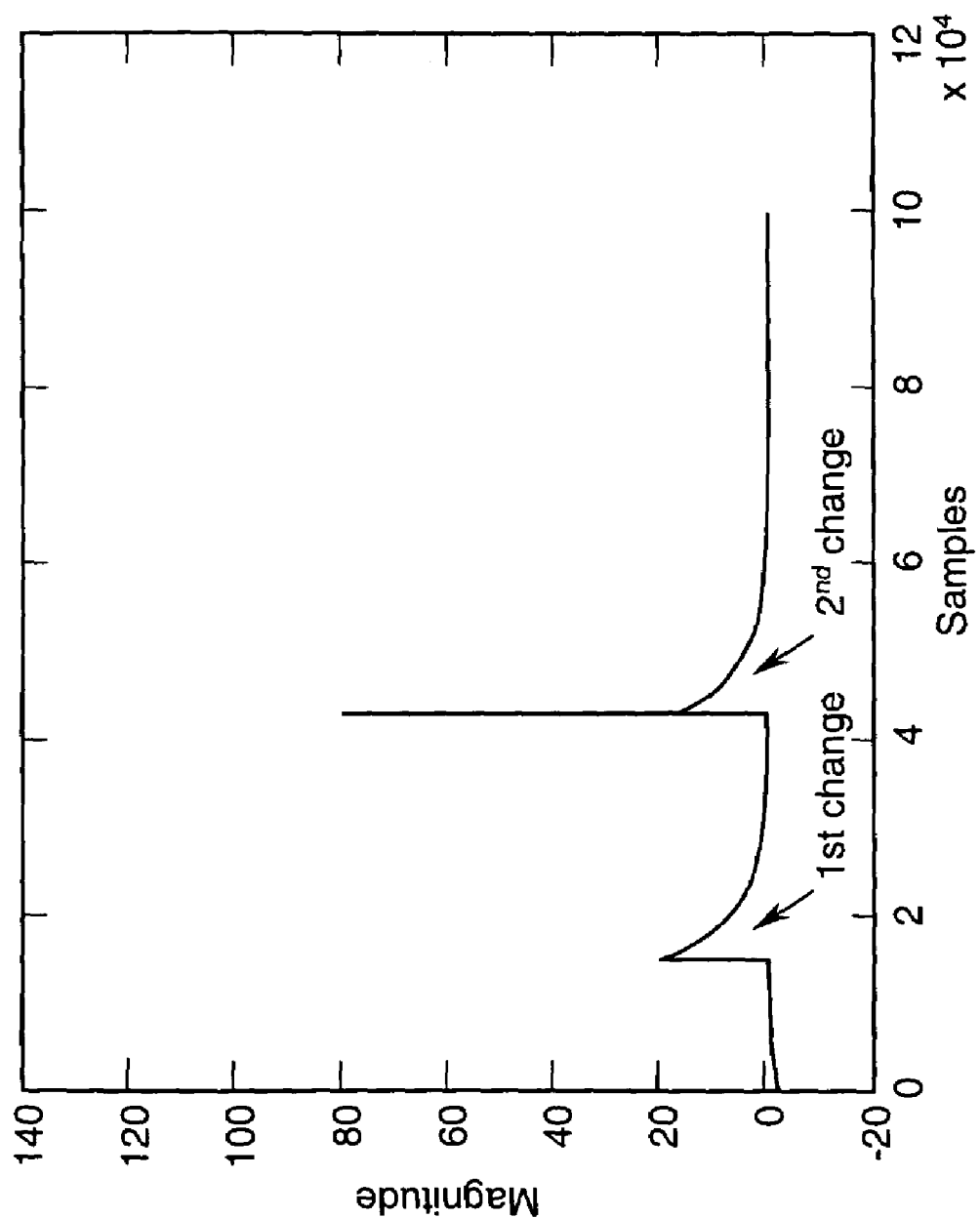
FIG. 7 is a graph showing the AGC error signal corresponding to FIGS. 5 and 6.
Figure 8:
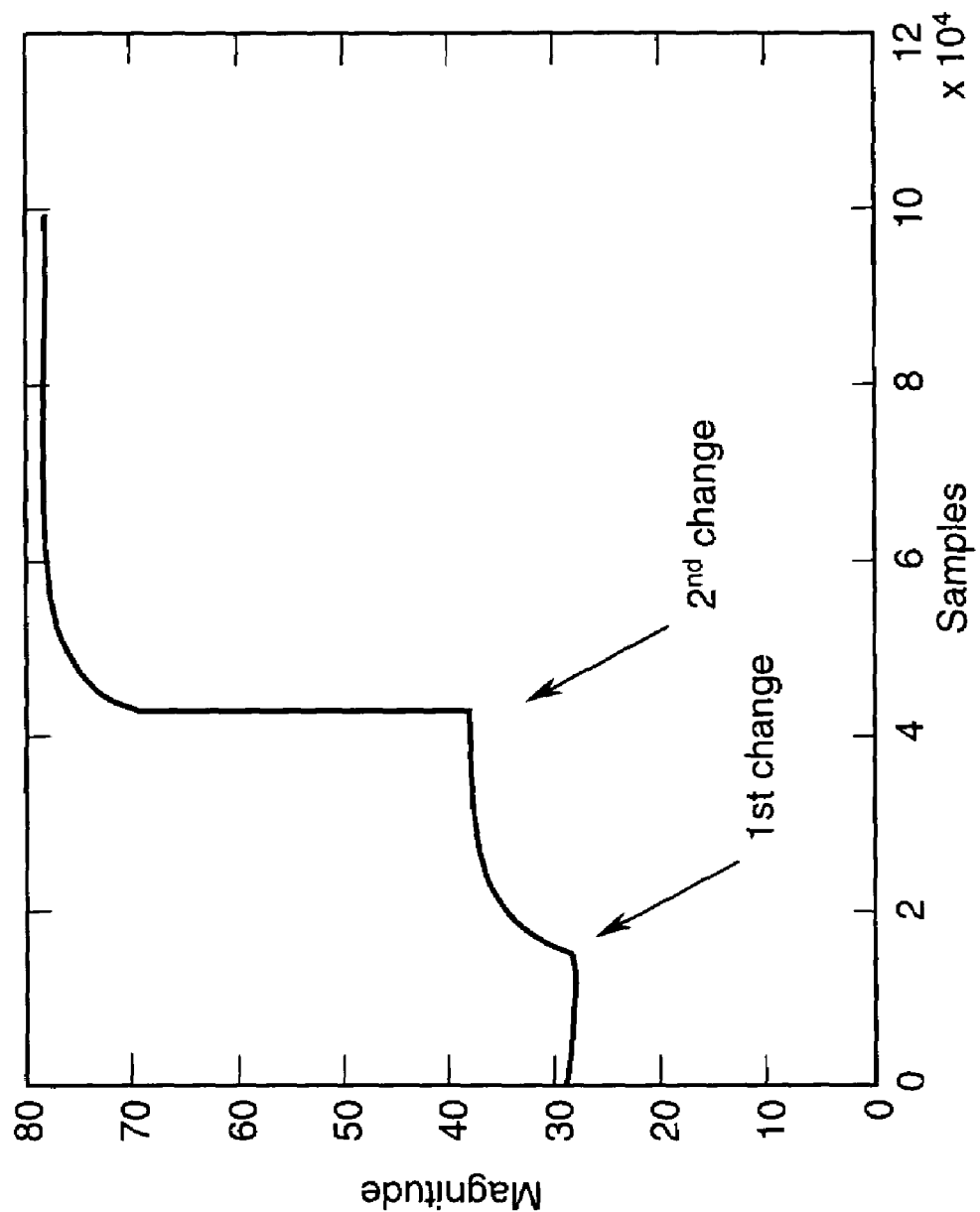
FIG. 8 is a graph showing the output of the AGC loop filter, corresponding to FIGS. 5-9.

FIG. 6 plots the in-phase signal after it has been adjusted by the AGC loop of the invention. Adjustment for the second step change is achieved in approximately the same time as adjustment for the first step change, even though the second step change was a much bigger reduction in signal power. The reason for the fast reaction to the greater step change is that the second change produced an average power change that exceeded the selected threshold, and resulted in the AGC loop switching to its coarse mode of operation. This is apparent from the plot of the AGC error signal in FIG. 7. The error signal spikes to a very large value at the time of the second step change and then quickly readjusts to a lower value. Finally, FIG. 8 shows the corresponding changes in the output of the AGC control loop.

It will be appreciated from the foregoing that the present invention represents a significant advance in the field of automatic gain control technology. In particular, the invention provides an AGC loop that has the stability advantages of first-order control loops, but is still able to react rapidly to sudden changes in received signal power. It will also be appreciated that, although an embodiment of the invention has been described in detail for purposes of illustration, various modifications may be made without departing from the spirit and scope of the invention. In particular, it should be noted that, because signals in the AGC loop are processed in digital form, most of the components and modules of the AGC loop are conveniently implemented in the form of software or some form of programmable hardware (firmware). The invention is not, however, limited to such implementations. Accordingly, the invention should not be limited except as by the appended claims.

The invention claimed is:

1. An automatic gain control (AGC) device for generating amplifier control signals to adjust a received communication signal that varies in power, to a desired level, the AGC device comprising:
    a first computational module, for generating a signal representative of the average power of the received communication signal, wherein the first computational module a) removes an effect of zero-mean white noise on the received communication signal and b) compresses a signal power of the received communication signal to allow a fast reaction to power changes;
    a second computational module, for generating an error signal representative of the difference between the average power signal generated by the first computational module and a selected power set point; and
    a third computational module, for generating an amplifier control signal from the error signal, wherein the generated amplifier control signal is responsive to variations in the average power of the received signal.

2. An AGC device as defined in claim 1, wherein the third computational module comprises:
    a loop gain amplifier for amplifying the error signal;
    a summing module for combining the amplified error signal with another input signal; and
    a delay module for receiving the output of the summing module and providing as output the amplifier control signal, wherein the other input signal to the summing module is derived from the amplifier control signal in an earlier computation cycle.

3. An AGC device as defined in claim 2, and further comprising:
    a fourth computational module for controlling the gain of the loop gain amplifier in accordance with average error signal power.

4. An AGC device as defined in claim 3, wherein the fourth computational module comprises:
    an error signal power determination module;
    an error signal sign determination module; and
    a gain decision module receiving input signals from the error signal power determination module and the error signal sign determination module, and selecting a loop amplifier gain based in the inputs received.

5. An AGC device as defined in claim 4, wherein the gain decision module comprises:
    a comparison module, for comparing the received error signal power with a threshold value, and selecting a first pair of loop amplifier gains for operation in a fine mode when the received error signal power is below the threshold, and selecting a second pair of loop amplifier gains for operation in a coarse mode when the received error signal is above the threshold;
    a sign detection module, for determining the algebraic sign of the error signal average power; and
    a sign-based gain selection module, for selecting one of the pair of loop amplifier gains selected by the comparison module, wherein the sign of the error signal average power is indicative of whether the AGC device should operate in an attack mode or a decay mode.

6. An AGC device as defined in claim 3, and further comprising:
    a set point selection module, wherein the power set point supplied to the second computational module is automatically selected based on measurements made on the received communication signal.

7. An AGC device as defined in claim 6, further comprising:
    a communication channel model, into which the received communication signal is input;
    an integrate-and-dump and logarithm operation module substantially similar to the first computational module, but for generating a signal representative of the average power of the received communication signal after it passes through the channel model; and,
    a differencing module, for generating a difference signal, representative of the difference between the average power of the received signal and the average power of the received signal after it passes through the channel model;
    wherein the set point selection module, chooses a set point value based on the value of the difference signal in comparison with a threshold.

8. An AGC device as defined in claim 1, wherein the first computational module generates a signal proportional to the square of the root-mean-square (rms) power of the received communication signal.

9. An AGC device as defined in claim 1, wherein the first computational module is coupled to the second computational module.

10. An AGC device as defined in claim 1, wherein the second computational module is coupled to the third computational module.

11. For use in a communications receiver, a method of automatic gain control, comprising the steps of:
    generating a signal representative of the average power of a received communication signal to a) remove an effect of zero-mean white noise on the received communication signal and b) compress a signal power of the received communication signal to allow a fast reaction to power changes;
    generating an error signal representative of the difference between the average power signal and a selected power set point; and
    generating an amplifier control signal from the error signal, wherein the generated amplifier control signal is responsive to variations in the average power of the received signal.

12. A method as defined in claim 11, wherein the step of generating en amplifier control signal comprises:
    amplifying the error signal in a loop gain amplifier;
    combining the amplified error signal with another input signal to produce a sum signal;
    delaying the sum signal and providing as output an amplifier control signal; and
    feeding the delayed output signal back to be used as the other input signal in the combining step, wherein the other input is derived from the amplifier control signal in an earlier computation cycle.

13. A method as defined in claim 12, and further comprising:

controlling the gain of the loop gain amplifier in accordance with average error signal power.

14. A method as defined in claim 13, wherein the step of controlling the gain of the loop gain amplifier comprises:
   determining the average power of the error;
   determining the algebraic sign of the average power of the error signal; and
   selecting, based on the error signal power the error signal algebraic sign, determination module, a loop amplifier gain.

15. A method as defined in claim 14, wherein the step of selecting a loop amplifier gain comprises:
   comparing the received error signal power with a threshold value, and selecting a first pair of loop amplifier gains for operation in a fine mode when the received error signal power is below the threshold, and selecting a second pair of loop amplifier gains for operation in a coarse mode when the received error signal is above the threshold;
   determining the algebraic sign of the error signal average power; and
   selecting one of the pair of loop amplifier gains selected by the comparing step, wherein the sign of the error signal average power is indicative of whether the AGC device should operate in an attack mode or a decay mode.

16. A method as defined in claim 13, and further comprising:
   automatically selecting the power set point used in the step of generating an error signal, based on measurements made on the received communication signal.

17. A method as defined in claim 16, wherein the step of automatically selecting the power set point comprises:
   inputting the received communication signal to a communication channel model;
   generating a signal representative of the average power of the received communication signal after it passes through the channel model;
   generating a difference signal, representative of the difference between the average power of the received signal and the average power of the received signal after it passes through the channel model; and
   choosing a power set point value based on the value of the difference signal in comparison with a threshold.

18. A method as defined in claim 11, wherein the step of generating a signal representative of the average power of the communication signal comprises generating a signal proportional to the square of the root-mean-square (rms) power of the received communication signal.

* * * * *